US012727282B2

(12) United States Patent
Stone et al.

(10) Patent No.: US 12,727,282 B2
(45) Date of Patent: Sep. 1, 2026

(54) SPHERICALLY CONFIGURED POWER CONVERSION MODULE FOR USE WITH OPTICAL ENERGY TRANSFER AND CONVERSION SYSTEM

(71) Applicant: Stone Aerospace, Inc., Del Valle, TX (US)

(72) Inventors: William C. Stone, Del Valle, TX (US); Bartholomew P. Hogan, Rockville, MD (US)

(73) Assignee: Stone Aerospace, Inc., De Valle, TX (US)

( * ) Notice: Subject to any disclaimer, the term of this patent is extended or adjusted under 35 U.S.C. 154(b) by 22 days.

(21) Appl. No.: 19/179,406

(22) Filed: Apr. 15, 2025

(65) Prior Publication Data

US 2026/0164847 A1 Jun. 11, 2026

Related U.S. Application Data

(60) Continuation of application No. 17/352,019, filed on Jun. 18, 2021, now Pat. No. 12,279,465, which is a division of application No. 14/292,495, filed on May 30, 2014, now Pat. No. 12,206,036.

(60) Provisional application No. 61/860,702, filed on Jul. 31, 2013.

(51) Int. Cl.

| | |
|---|---|
| ***H10F 77/42*** | (2025.01) |
| ***H02S 40/22*** | (2014.01) |
| ***H02S 40/42*** | (2014.01) |
| ***H02S 40/44*** | (2014.01) |

(52) U.S. Cl.

CPC ........... *H10F 77/484* (2025.01); *H02S 40/22* (2014.12); *H02S 40/42* (2014.12); *H02S 40/44* (2014.12); *Y02E 10/52* (2013.01); *Y02E 10/60* (2013.01)

(58) Field of Classification Search

None

See application file for complete search history.

*Primary Examiner* — Dustin Q Dam

(74) *Attorney, Agent, or Firm* — Miguel Villarreal, Jr.; Gunn, Lee & Cave, P.C.

(57) ABSTRACT

A spherically configured power conversion module for use with optical energy transfer and conversion system has a housing, an array of photovoltaic chips mounted on the interior thereof, and inlet and outlet ports connected thereto. An end plate connected to the housing defines a cavity. An actively cooled high-power connector has one end connected to a fiber optic cable and the opposite end traversing the end plate and extending within the cavity. Beam forming optics and an optical splitter within the cavity are in optical communication with the connector to disburse received optical energy toward the array of photovoltaic chips mounted to the housing within the cavity, each chip spaced equidistantly from the beam forming optics. A heat sink within the housing has fluid channels where a work fluid removes heat via the outlet port. In an alternative embodiment, a multiple power conversion system includes a plurality of conversion modules.

2 Claims, 10 Drawing Sheets

58
58
58
58
58
58
56

58
58
58
58
58
54

62
58
58
58
58
58
58
58

60
58
58
58
58
58
58

SPHERICALLY CONFIGURED POWER CONVERSION MODULE FOR USE WITH OPTICAL ENERGY TRANSFER AND CONVERSION SYSTEM

CROSS REFERENCE TO RELATED APPLICATIONS

This is a continuation application claiming priority to and the benefit of U.S. application Ser. No. 17/352,019, filed Jun. 18, 2021, entitled "Power Conversion Module for Use With Optical Energy Transfer and Conversion System," a divisional application claiming priority to and the benefit of U.S. application Ser. No. 14/292,495, filed May 30, 2014, and entitled "Power Conversion Module for Use With Optical Energy Transfer and Conversion System," which claims priority to and the benefit of U.S. provisional application Ser. No. 61/860,702, filed Jul. 31, 2013, and entitled "Non-Line-of-Sight Remote Optical Power Conversion," all of which are incorporated by reference herein. U.S. application Ser. No. 13/303,449, filed Nov. 23, 2011 and entitled "Optical Energy Transfer and Conversion System," is incorporated by reference herein.

STATEMENT REGARDING FEDERALLY SPONSORED RESEARCH OR DEVELOPMENT

This invention was made with Government support under Grant No. NNX10AE29G awarded by NASA. The Government has certain rights in this invention.

BACKGROUND OF THE INVENTION

1. Field of the Invention

The present invention relates to power systems. More specifically, the present invention is an improved beam dump for use in a system that transfers optical energy to a remote location and subsequent conversion of the transferred optical energy to another form of energy such as heat, electricity, or mechanical work.

2. Description of the Related Art

U.S. application Ser. No. 13/303,449 (the '449 Application) describes the development of an integrated collection of systems that enable the transmission and effective end-use of very large amounts of optical power (kilowatts to tens of megawatts) over relatively long distances (from a kilometer to as much as one-hundred kilometers or more) to fixed, movable, or mobile platforms operating on the ground, undersea, under ice, in the air, in space, and on other planets. The concept is inherently non-line-of-sight, which allows it to directly bypass severe problems that have plagued efforts to utilize laser power beaming over large distances through the atmosphere, underwater, and over terrain where the receiver is not within view of the optical power source.

The '449 Application previously disclosed, inter alia, a ground-based (or base-of-operations-based) power supply with a chilling system used to provide sufficient electrical power and appropriate coolant to a high power fiber laser directing power into an optical fiber. For the purposes of this discussion "laser power" and "optical power" are used interchangeably to refer to any wavelength of electromagnetic radiation that can be effectively injected into a small diameter fiber (generally less than one millimeter in diameter, but potentially larger) that is fabricated from a material that is optically transparent at the selected wavelength.

One aspect of the '449 Application is power re-conversion to electricity and mechanical power at the far end of the fiber. In several cases described in the '449 Application, a "beam dump" is used where the optical energy carried by the fiber is expanded into a diffuse, divergent or collimated broad beam, and caused to impinge directly or indirectly on a thermal mass capable of withstanding the intense heat that will be produced. The beam dump can be advantageously fabricated from a high temperature refractory material, e.g., beryllium oxide (BeO) or similar material, but can also, with careful design and heat removal methods, be made to work with common materials such as aluminum, copper, or steel.

In one variation, the beam dump is surrounded by a plurality of thermoelectric conversion (TEC) chip arrays that convert heat directly to electricity on the basis of thermal difference between the core of the beam dump and its exterior environment. This approach is particularly effective for polar regions and planetary robotics operations where external ambient temperatures can be extremely low. In another variation, the expanded laser beam energy impinges directly onto an advantageously tuned-wavelength photovoltaic array (or any generalized array of devices that respond to light within the vicinity of the laser wavelength and directly produce electricity) that converts light directly to electricity. In yet a third variation, the beam dump is used directly as the heat source for a heat engine, e.g., a Stirling cycle engine, from which mechanical power can be directly extracted and electrical power can be secondarily generated at the remote mobility platform. All of these power conversion systems can produce electricity that can be directly consumed by a remote mobility platform (or stationary sensing, communications or power transfer platform), used to run its onboard electronics, heaters, sensors, actuators, electric motors and other "hotel" and mobility energy needs and, as well, to recharge a regenerable onboard local power supply, as for example, a high energy lithium-ion battery, a hydrogen-oxygen fuel cell or the like.

While the raw (coherent) optical power of a focused laser beam has certain utility at remote locations, the conversion of that optical power to electrical power has very broad application. Specifically, the efficient conversion of photons to electrical power enables the direct and immediate use of common (and existing) remote machinery that has been designed to operate (or could be made to operate) on electrical power. The most immediate example is that of remotely operated (underwater) vehicles (ROVs) and autonomous underwater vehicles (AUVs). Both are used extensively in the petroleum industry for underwater construction, assembly, maintenance, and inspection. In the specific case of ROVs, which are the workhorse of offshore oil production today, these are currently limited in their utility and cost effectiveness by the requirement of being chained by a heavy, bulky electrical power tether to an overhead ship or other floating platform. As the operating depth (or horizontal distance from a power supply) of an ROV increases, the supply voltage in the tether must be increased to compensate for resistance losses. The cable cross section, and its required thickness of insulation to prevent arc-over, increase proportionately until the cable weight and the drag forces on the cable produced by ocean currents can only be handled by large, expensive sea vessels.

FIG. 8 of the '449 Application shows the photon flux being transported to a beam dump housing by fiber. Inside the beam dump, the beam is expanded, shaped and optionally collimated by beam-forming optics. The expanded beam then impinges on the photovoltaic (PV) array for direct generation of electrical power. Because only a portion of the photons will be converted to useful electrical current by the PV array, the rest go into heating the beam dump. That excess heat generates additional electrical power, such as by using a cylindrical array of thermoelectric converter (TEC) chips mounted against the inside wall of the beam dump. The beam dump contains within its structure an efficient heat exchanger (shown as coils through which a conducting fluid could pass to remove heat, but which equally well could be done by other means such as heat pipes and the like) for the purpose of cooling the back side of the TEC chip array to provide the temperature differential needed by the TEC array to generate electricity, as the level of current produced is proportional to the temperature differential across the TEC array.

But the power conversion design disclosed in FIG. 8 of the '449 Application is inefficient on several counts. The present invention addresses some of these inefficiencies in a manner that provides, inter alia, practically-implementable sub-sea power converters for the operation of such industrial devices as ROVs, AUVs, and permanent sub-sea power distribution, communications, and instrumentation stations and bases for ROVs and AUVs.

Optical power delivery requires that the photon flux (power) density reaches extremely high levels within the optical carrier. As of 2009, power densities exceeding two terawatts per square centimeter (2 $TW/cm^2$) had been achieved. In contrast, the allowable sustained photon flux on a wavelength-optimized photovoltaic (PV) chip is currently about ten watts per square centimeter (10 $W/cm^2$), which is about two-hundred billion times less than the source flux (higher flux tolerances of up to five hundred $W/cm^2$ are reported for sunlight concentrators, but this is still four billion times less than the peak laser flux).

The interest in using photovoltaics for power conversion of a photon stream is obvious: Direct conversion of photons to electrons with efficiencies as high as forty-two percent (42%) are possible in current laboratory grade PV chips, and this number is expected to climb in the coming years. As such, there is great motivation to get as much of the power converted directly before resorting to secondary methods that utilize waste energy (mainly heat) for power generation. Approaches have been developed to do this on a small scale (i.e., milliwatts), but none to date have attempted to deal with the substantial problem of converting kilowatts to megawatts for industrial grade remote power utilization where a high energy laser is the power source.

Another factor in the design of a remote photon-powered electrical generator is that of temperature sensitivity of the various power conversion devices. Currently-available PV chips are temperature sensitive with output efficiency decreasing with increasing temperature. Peak output efficiency usually occurs around zero degrees Celsius (0° C.) with limiting (i.e., destructive) temperatures in excess of one hundred degrees Celsius (100° C.).

Conversely, a TEC chip only begins to see its highest conversion efficiency at high differential temperatures. Generally, minimum TEC differential operating temperatures start at twenty-five degrees Celsius (25° C.) and reach peak efficiency at greater than a temperature difference of two hundred degrees Celsius (200° C.). Even at the high end of this scale, however, conversion efficiency is only on the order of five percent. Contrasting this, a well-designed heat engine (e.g., a free piston Beta-type Stirling engine) can achieve better than thirty-seven percent (37%) conversion of thermal (heat) energy to electrical energy using helium working fluid and linear alternators for the conversion from mechanical action to electricity.

These factors place significant design constraints on possible solutions for highly-efficient conversion of high energy optical power to electrical power at a remote industrial vehicle or industrial machine.

The present invention uses a tightly integrated "mixed-mode" power converter "cluster" system that receives optical power from a remote laser and converts that in stages to electrical energy. Under ideal conditions the following "mixed-mode" power generator can be constructed as illustrated in the table below:

TABLE 1

Four-Stage Mixed-Mode High Energy Optical Power Converter

| Step | Conversion Method | Primary Power Source | Percentage optical input ultimately converted to electricity |
|---|---|---|---|
| 1 | Photovoltaic | Mono-wavelength light | 42 |
| 2 | TEC | Waste heat | 2.9 |
| 3 | Primary Stirling Generator | Waste heat | 20.7 |
| 4 | Secondary Stirling Generator | Waste heat | 12.9 |
| | | Total Electrical Conversion Efficiency | 78.5 |

As shown in Table 1, for every optical Watt of power that reaches the beam dump, forty-two percent (42%) can be converted directly to electrical power by a properly constructed photovoltaic array. The waste heat can be used to drive a TEC thermoelectric generator, which can recover an additional 2.9% of the initial power. If the remaining waste heat is piped (using insulated isothermal transfer systems) to a high efficiency Stirling generator (or similarly efficient heat engine), then 20.7% of the initial optical power can be converted to electricity. If the output from the hot stage of the first Stirling generator is cascaded to a second unit, then an additional 12.9% power conversion can be achieved, and so on. If a system only has the four stages depicted in Table 1, 78.5% of the initial Watt of input optical power that reaches the beam dump will be converted to electricity. Designing this capability into a compact, manufacturable device that can work in deep water is one objective of the invention described herein. A simplified system that captures most of the energy would utilize only Steps 1 and 3 in the above table.

The sequence shown above is the most efficient way to collect and convert the power. If one-hundred percent (100%) PV conversion efficiencies could be achieved then the remaining power conversion steps could be eliminated. Thus, another objective of the present invention is to maximize the PV conversion of the optical energy during the first stage of the system.

TEC power conversion operates best at locations where very high thermal gradients exist. In the laser beam dump scenario described here, the highest thermal gradients will be immediately adjacent the beam dump. Thus, locating a TEC generator array elsewhere would be inefficient. Although Stirling generators also prefer high temperature gradients, they can operate efficiently at lower temperatures and lower temperature gradients.

"Heat exchanger," as used herein, refers to any method of capturing, extracting and transferring of heat from one location (e.g., the core of the beam dump) to a different location (e.g., a Stirling engine adjacent to the beam dump) such that maximum electrical energy can be derived from the photonic energy delivered to the beam dump.

BRIEF SUMMARY OF THE INVENTION

The present invention is a power conversion system for converting optical energy received from a fiber optic line to electrical energy. The system comprises a housing having at least one interior surface, said at least one interior surface defining an interior space within said housing; a high power connector having a first end and a second end, said first end coupled to the fiber optic line, and the second end positioned within the interior space; beam-forming optics within the interior space positioned proximal to the second end of the said connector, said beam-forming optics having a focal plane; an end array having a first plurality of PV chips, said first plurality of PV chips in a partially-spherical arrangement spaced a first radial distance from said beam forming optics; at least one annular array having a second plurality of PV chips, said second plurality of PV chips in an annular arrangement, said at least one annular array longitudinally positioned between said end array and said beam forming optics; and wherein each PV chip of said first and second pluralities of PV chips comprises a light-receiving surface having a normal vector intersecting the focal plane of said beam-forming optics.

DETAILED DESCRIPTION OF THE INVENTION

Figure 1:
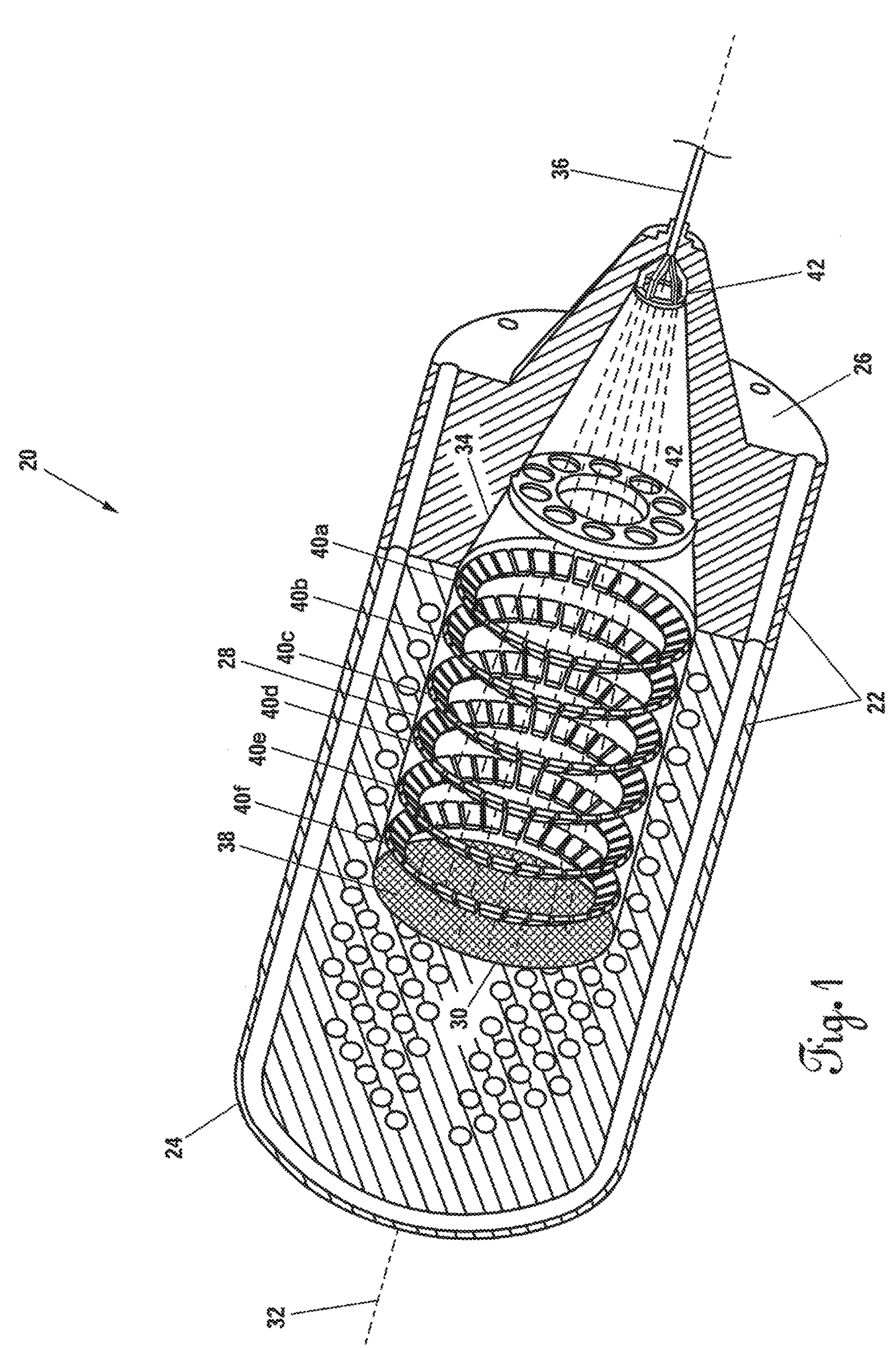
FIG. 1 is a partial sectional view of one embodiment of the present invention.

FIG. 1 shows a single-stage photovoltaic (PV) power conversion beam dump or module 20 designed for deep water use. The module 20 has a generally cylindrical high pressure housing 22 comprising a housing body 24 and a pressure end plate 26 that can be removed for service access to the interior of the module 20. The housing body 24 has an interior cylindrical surface 28 adjacent to a closed end surface 30 that defines a first cavity having a closed end and an open end. The first cavity is formed around a centerline 32 that extends through the module 20. The end plate 26 includes a partially-conical interior surface 34 that defines a generally conical second cavity opening toward and adjacent to the first cavity. The second cavity is formed around the centerline 32, and together with the first cavity defines the interior of the module 20. A photon source (not shown) is connected to end plate 26 via fiber optic line 36. A flat or partially-spherical PV end array 38 is located within and proximal to the closed end surface 30 of the first cavity. Annular PV arrays 40*a-f* are spaced within the first cavity between the end array 38 and the beam forming optics 42. Beam-forming optics 42 direct optical energy received from the photon source toward the arrays 38, 40*a-f*.

Figure 2:
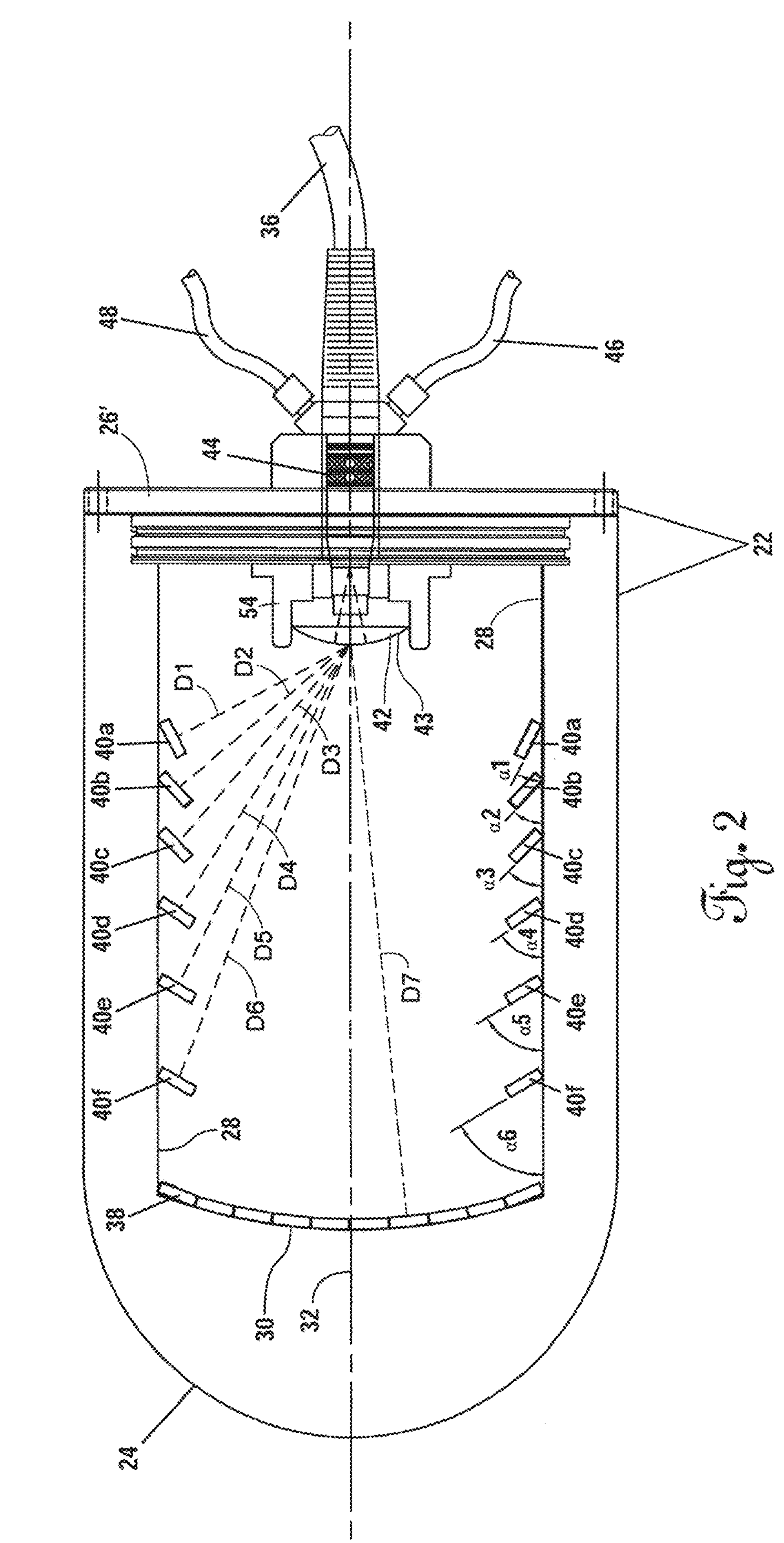
FIG. 2 is a partial sectional view of a second embodiment.

FIG. 2 shows a different embodiment 52 than that shown in FIG. 1, but with many of the same elements, which are identified by the same reference numbers. This second embodiment 52 includes a flat end plate 26'. Beam forming optics 42 are fixed to a mount 54 attached to and extending into the cavity from the end plate 26'.

In the second embodiment 52, the fiber optic line 36 is coupled to the end plate 26' at a first end of a high power connector 44 that includes a water-cooling inlet port 46 and outlet port 48 that completes a fluid circulation path cooling the high power connector 44 during use. The second end of the high power connector 44 is positioned within the cavity proximal to the beam forming optics 42. The beam forming optics 42 can be multi-stage standard optic and Fresnel optics, with and without uniform and non-linearly applied anti-reflective, wavelength-specific coatings. The beaming-forming optics 42 have a focal plane 43 that serves to widen and disperse the beam into a broad pattern that impinges on each of the arrays 38, 40*a-f*.

Figures 3, 4:
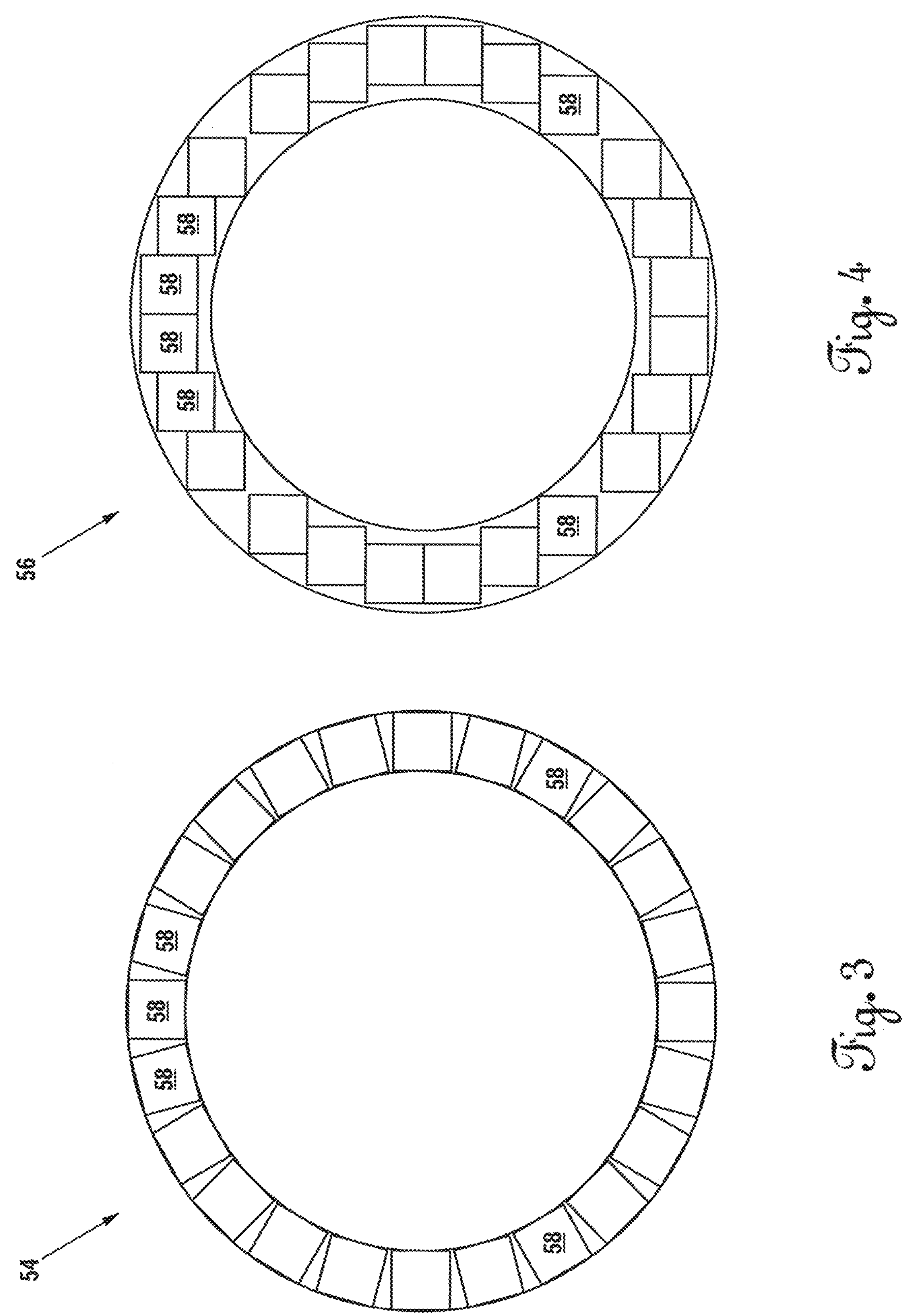
FIGS. 3-4 show several possible geometric orientations for the arrangement of currently manufactured PV chips for use in the end-face power generation surface that lines the direct end-face target for the expanded photon beam in a cylindrical beam dump core.

FIGS. 3-4 show two typical configurations—a radial design 54 and a rectilinear design 56—for the annular PV arrays 40*a-f* shown in FIG. 2. Each design 54, 56 contemplates fabrication using standard fifteen millimeter square PV chips 58, with an objective to create the greatest PV exposure area on each annular ring while using commonly available PV chips. Alternatively, a custom full PV coverage array could also be fabricated. Existing PV chips frequently have a square geometry with a flat light-receiving surface with a characteristic edge dimension on the order of fifteen millimeters, although custom chips of almost any shape can be fabricated.

Figures 5, 6:
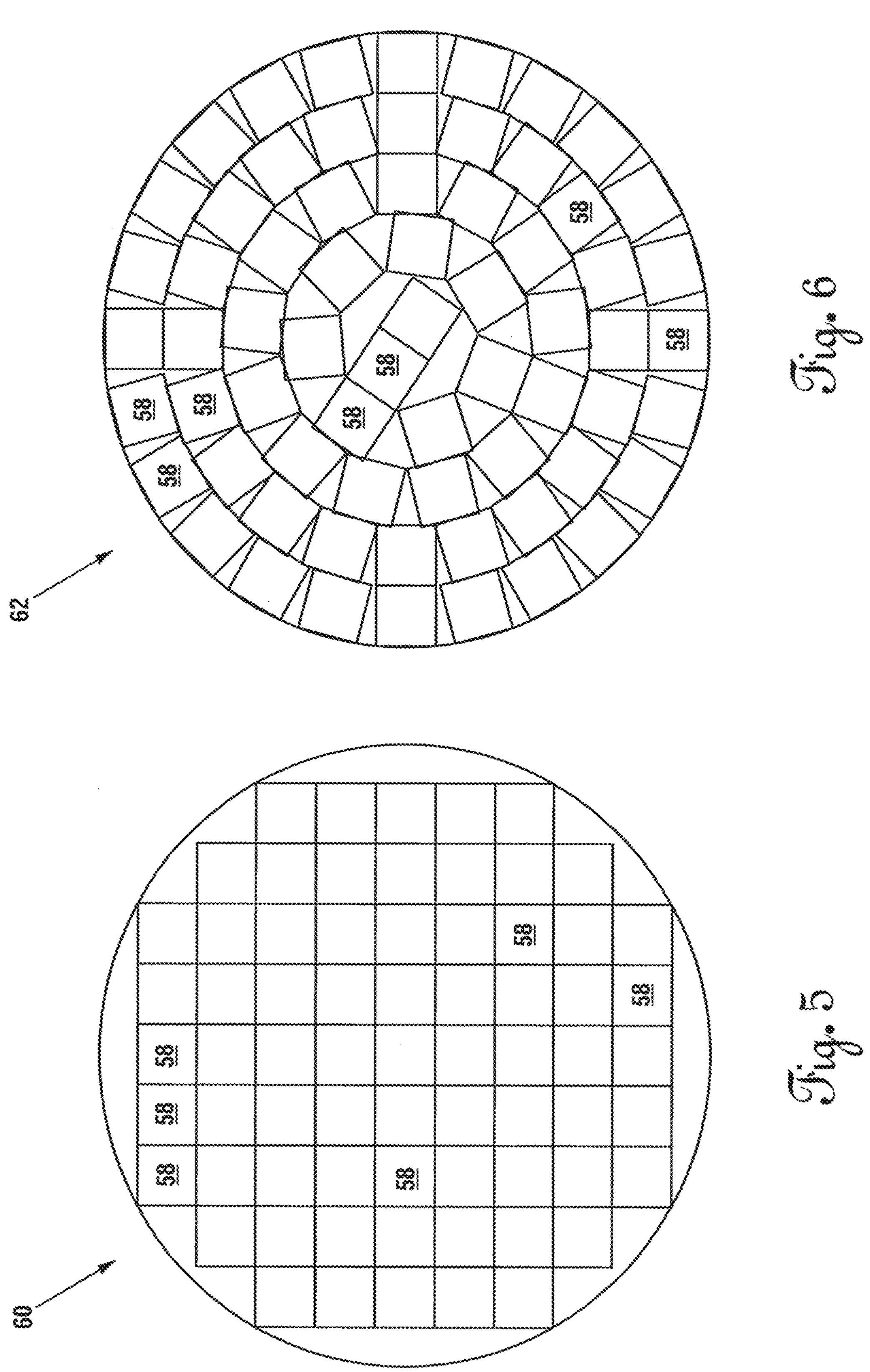
FIGS. 5-6 show a modified solid model cross section of a cylindrical beam dump showing the addition of the annular power generation PV rings.

FIGS. 5-6 depict the same approach to rectilinear and radial topologies 60, 62, respectively, for the partially-spherical PV end array 38 of FIGS. 1-2. Further, in practical implementation, the PV end array 38 can also be flat without significant power generation loss. FIGS. 3-6 show best case realizations of advantageous PV array geometries using currently available PV chip production methods. It may be appreciated that completely filled geometries representing the annuli of FIGS. 3-4 and the disks of FIGS. 5-6 may be one day manufacturable.

Referring back to FIG. 2, the annular arrays 40*a-f* are located at radial distances D1-D6, respectively, from the focal plane 43 of beam forming optics 42 and are oriented at angles $\alpha$1-$\alpha$6 relative to the centerline 32. In other words, the PV chips composing the arrays 40*a-f* face the focal plane 43. The end array 38 is located at a radial distance D7 from the focal plane 43 such that the annular arrays 40*a-f* are positioned longitudinally between the end array 38 and the beam forming optics 42. As used herein, the “angle” of the array refers to the angle of a vector normal to the PV chips light-receiving surface composing the array relative to the centerline. Similarly, a PV chip "faces" a direction or element when the normal vector is parallel to the direction and intersects the element. In an alternative embodiment, the PV chips composing of the arrays 40*a-f* face back toward the end array 38.

The annular PV arrays 40*a-f* triple the available photovoltaic area relative to a module otherwise only equipped with an end array 38. The surface area can be further expanded by hypothetically lengthening the module 52 and cavity along centerline 32 while maintaining the same internal diameter as shown in FIG. 2 and adding more PV annular arrays along the length of the cavity. As the PV annular arrays are placed further from the beam forming optics 42, the power received per unit surface area will decrease proportional to $1/R^2$, where R is the radial distance (e.g., D1-D7) from the beam forming optics 42.

Figure 7:
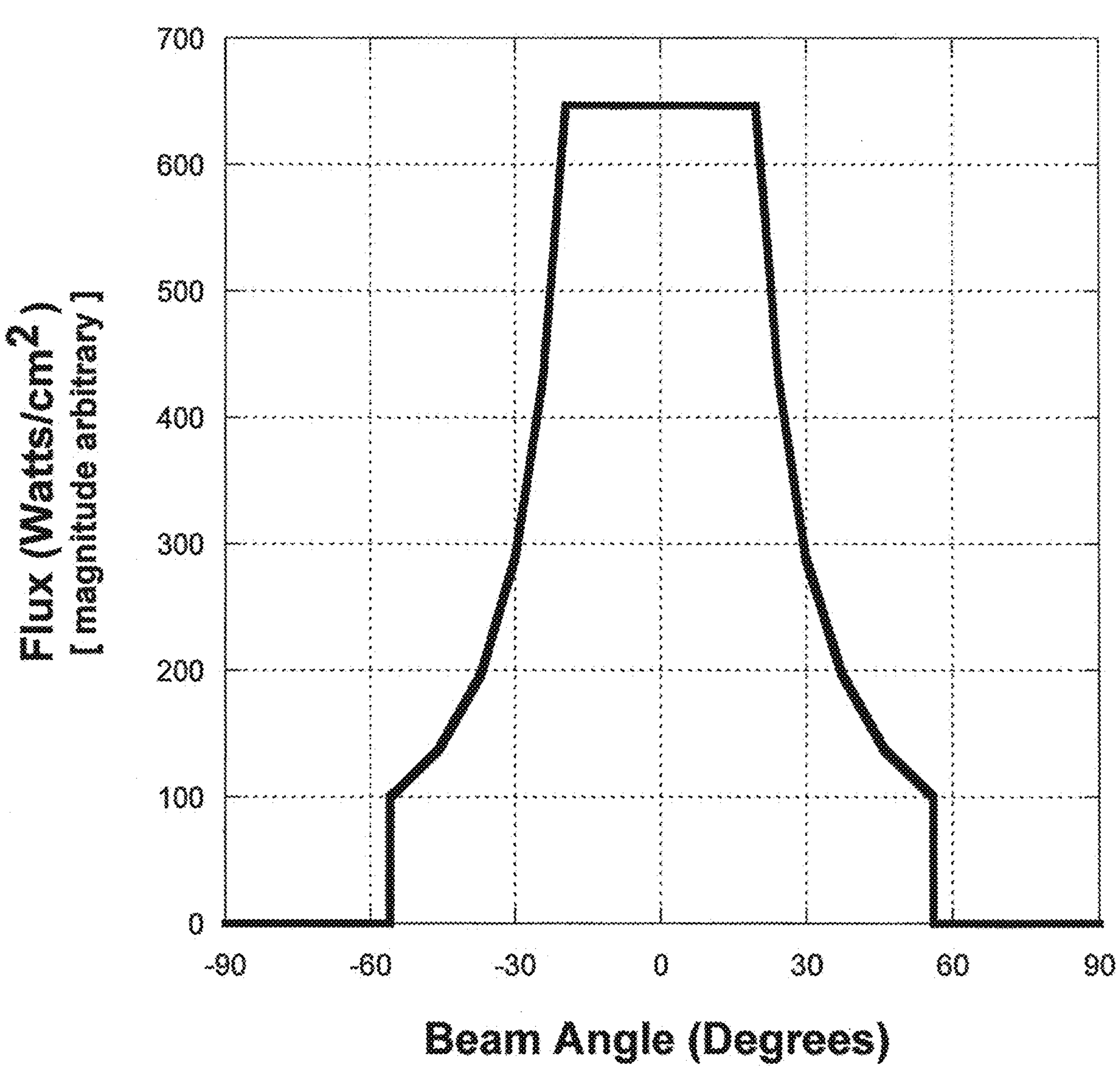
FIG. 7 shows a plot of an ideal beam profile for a cylindrical beam dump with radial PV arrays, such as the embodiments shown in FIGS. 1-2.

To maintain a uniform flux on each PV array, which is essential to maximize the efficiency per unit volume of the power conversion module, the beam forming optics 42 are designed to generate a beam profile similar to that shown in FIG. 7. This beam profile has an arbitrary starting off-axis angle that is symmetrical about a centerline and is defined by the flux received at the first annular PV array 40*a*. Thus, for the first PV array 40*a* in FIG. 2, the off-axis angle is approximately fifty-five degrees (and its mirror, −55 degrees). The beam forming optics 42 confine light to within this angular range and the flux is zero outside this range. The flux being received at the first PV array 40*a* is arbitrarily set to be 100 W/cm$^2$. The flux at the second through sixth arrays 40*b-f* and the end array 38 must increase to accommodate the increased radius from the beam forming optics 42. The rate of flux increase needed to maintain uniform flux per unit of PV surface area is proportional to the radius of each annular array until the end array 38 is reached.

FIG. 7 depicts a flux of 650 Watts/cm$^2$, which is arbitrary for illustrative purposes. The profile shown in FIG. 7 can be obtained through proper optical design using both continuous (glass) optics as well as Fresnel ring optics. The latter approach (Fresnel) can be used to create step-wise increases in photon flux that could match the discrete spacing of the annular PV rings 40*a-f* shown in FIGS. 1-2.

Figure 8:
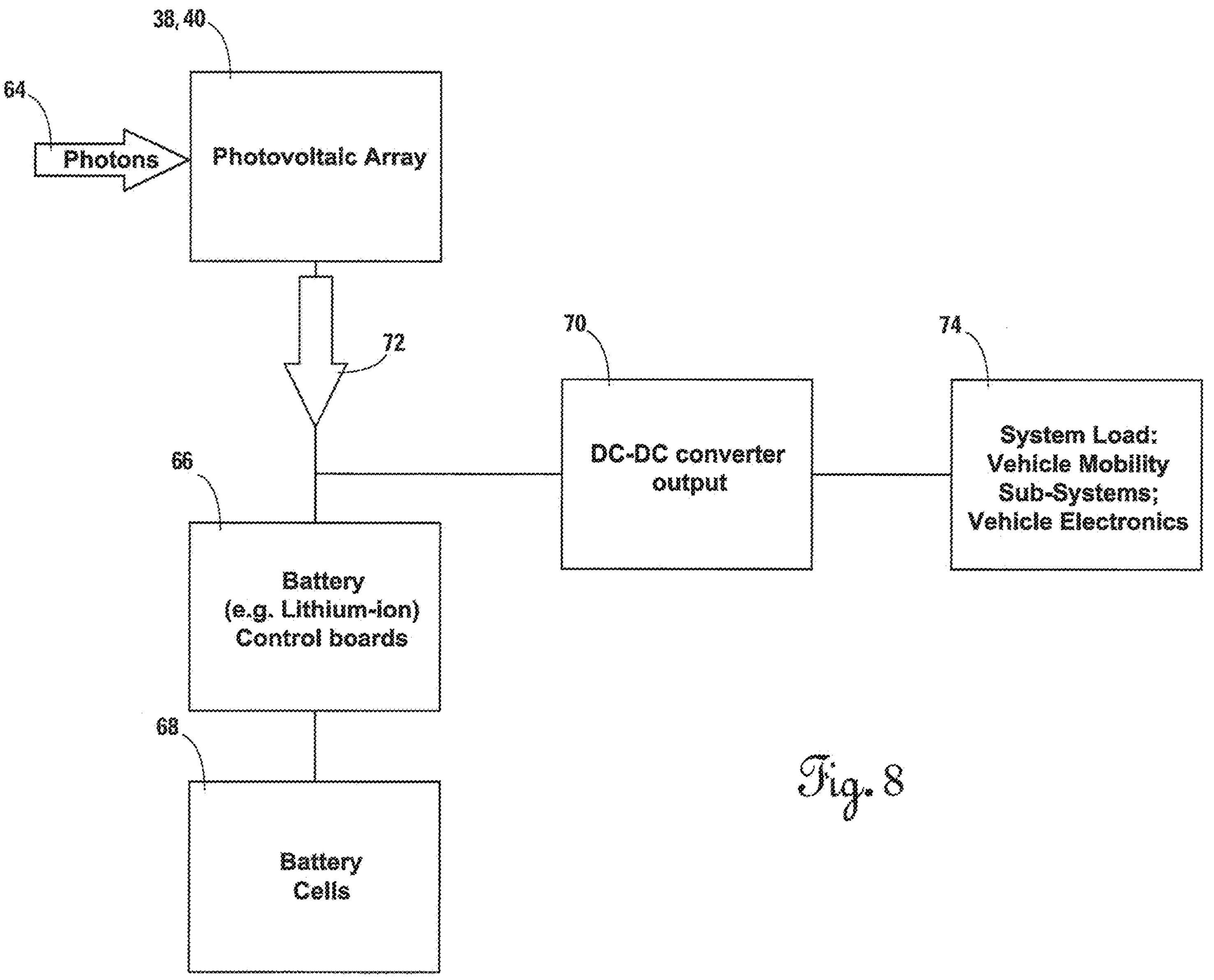
FIG. 8 shows a schematic of a vehicle power control system based solely on a PV array being used to generate electricity.

FIG. 8 shows a schematic of a vehicle power control system based solely on a PV array being used to generate electricity. Photons 64 arriving via fiber optic line 36 are caused by beam forming optics 42 to impinge on the PV arrays 38, 40*a-f*. The arrays 38, 40*a-f* are designed to provide optimal battery-charging voltage 72 to an onboard battery comprising battery electronic control systems 66 and battery cells 68. A DC-to-DC power converter 70 converts the bus voltage 72 to an appropriate level for use by system load 74. The system load 74 could be any power consumer performing useful work at the receiving end of the optical power, including but not limited to operation of vehicle mobility systems, vehicle electronics, remote instruments and actuators as well as recharge systems for vehicles and systems that can dock to the power conversion system, etc. The battery sub-systems 66, 68 provide a buffer for the overall electrical operation of the vehicle in the event of a momentary cessation of optical power, i.e., photons 64.

Figure 9:
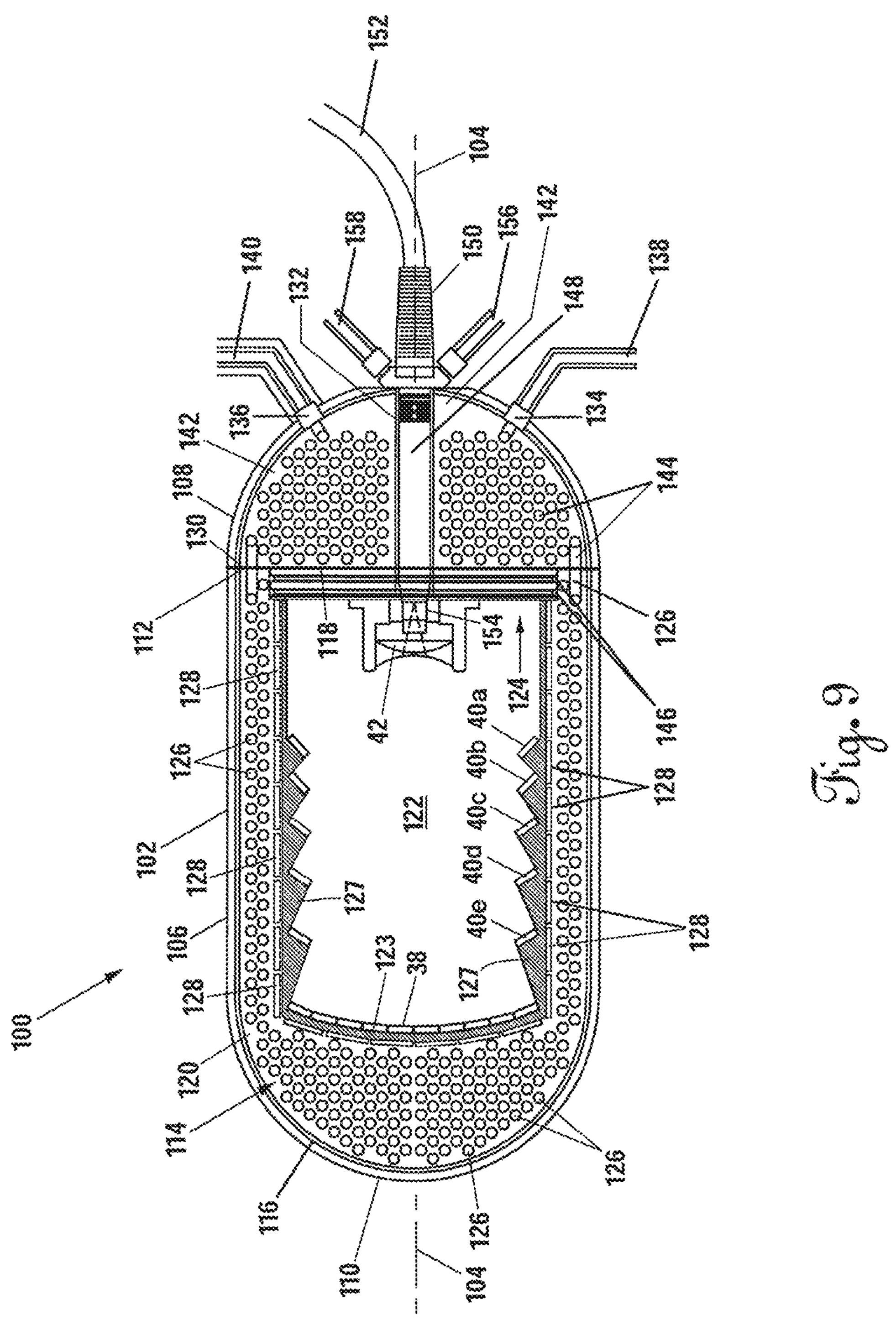
FIG. 9 is a partial section view of an alternative embodiment of the invention.

FIG. 9 shows an alternative embodiment 100 having a housing assembly 102 with a hemispherical geometry on both ends. The embodiment 100 is generally cylindrical and symmetrical about a longitudinal axis 104. The housing assembly 102 comprises a main housing 106 connected to an end housing 108. The main housing 106 is generally cylindrical with a closed hemispherical end 110 and an open end

112. The main housing 106 has a closed partially-spherical end 116, though a flat ended configuration would also suffice with close to the same efficiency, and an open end 118 coterminal with the open end 112 of the main housing 106.

Still referring to FIG. 9, the annular PV arrays 40*a-e* are mounted to a heat sink 127 which may be fabricated out of any material that is a conductor, including ceramics (e.g., beryllium oxide), metals (e.g., silver, copper, or aluminum), and carbon (including formed components using diamond powder, short carbon fibers, and grapheme). The PV arrays 40*a-e* are mounted on the interior surface of the heat sink 127 using thermally conducting compounds, generally consisting of grease base compositions of ceramic powders (e.g., beryllium oxide, aluminum nitride, aluminum oxide, zinc oxide or silicon dioxide), solid metal particles (e.g. silver or aluminum), or carbon (diamond powder, short carbon fibers, or graphene). An array of thermoelectric convertor (TEC) chips 128 is optionally mounted to the exterior side of the heat sink 127 to sense the hot side of the beam dump or module 100.

A ceramic main heat sink 120 occupies the main housing 106 and is formed around a generally-cylindrical cavity 122 having a partially-spherical closed end 123 and an open end 124. The partially-spherical closed end 123 can also be in a flat configuration with minimal loss of power conversion capability. The heat sink 120 is formed of beryllium oxide, but may alternatively be fabricated from any material that is a conductor, including other ceramics, metals, and carbon based materials. A number of first fluid channels 126 extend around and through the main heat sink 120. A number of TEC chips 128 are positioned adjacent to the main heat sink 120 and the boundary of the cavity 122.

The end housing 108 is hemispherical with an open end 130 and has a channel 132 extending to the open end 130 around the longitudinal axis 104. The end housing 108 includes a fluid inlet 134 and a fluid outlet 136 connected to pipe segments 138, 140, respectively.

A second heat sink 142 occupies the end housing 108. A number of second fluid channels 144 extend around and through the second heat sink 142. The first and second fluid channels 126, 144 form fluid communications paths that extend within the main heat sink 120, within the second heat sink 142, and between the main and second heat sinks 120, 142. The second fluid channels 144 are also in fluid communication with the fluid inlet 134 and fluid outlet 136.

Seals 146 are interposed between the main housing 106 and end housing 108. The end housing 108 closes the cavity 122, which contains a partially-spherical photovoltaic array 38 proximal to the closed end 123 and a number of annular photovoltaic arrays 40*a-e* positioned longitudinally between the array 38 and the end housing 108. Each annular array 40*a-e* is oriented to face beam forming optics 42 positioned in the cavity 122 between the annular arrays 40*a-e* and the seals 146. The beam forming optics 42 are configured to direct equal amounts of optical energy to each array 38, 40*a-e* while considering the distance of each respective array from the focal plane, as described with reference to FIG. 7.

A high power connector 148 is positioned in the channel 132 and connected at one end 150 to a fiber optic line 152. A second, opposing end 154 of the connector 148 is positioned in the cavity 122 and oriented to direct optical energy toward the beam forming optics 42. The connector 148 includes an inlet port 156 and an outlet port 158 in fluid communication with a pump (not shown) for the purpose of providing thermal control of the connector 148 and the beam forming optics 42.

As described with reference to FIGS. 1-8, optical power is delivered to the embodiment 100 via the fiber optic line 152, and is emitted from the second end connector 154 toward beam forming optics 42, which expand the beam and cause it to impinge on the annular PV arrays 40*a-e* and partially-spherical PV end array 38 with a uniform flux at each array. As they are impinged by optical energy, the arrays 38, 40*a-e* convert a portion of the optical energy to electricity. Waste heat is transferred to the heat sink 120. A working fluid circulating through the channels 126, 144 transfers heat to a work object or a heat engine (e.g., a Stirling engine) via pipe segment 140 which removes the heat from the heat sinks 120, 142 and uses the heat to perform work and/or generate additional electrical power.

FIG. 9 is illustrative of a three-stage power conversion system where optical power is converted to electric power via PV arrays 40*a-e*, mounted on heat sink 127. The excess heat is then transferred via pipe segment 140 to a Stirling engine (not shown) which converts the heat to electrical power. Any excess heat can then be transferred to a second Stirling engine (not shown) which then converts the heat to electrical power.

Figure 10:
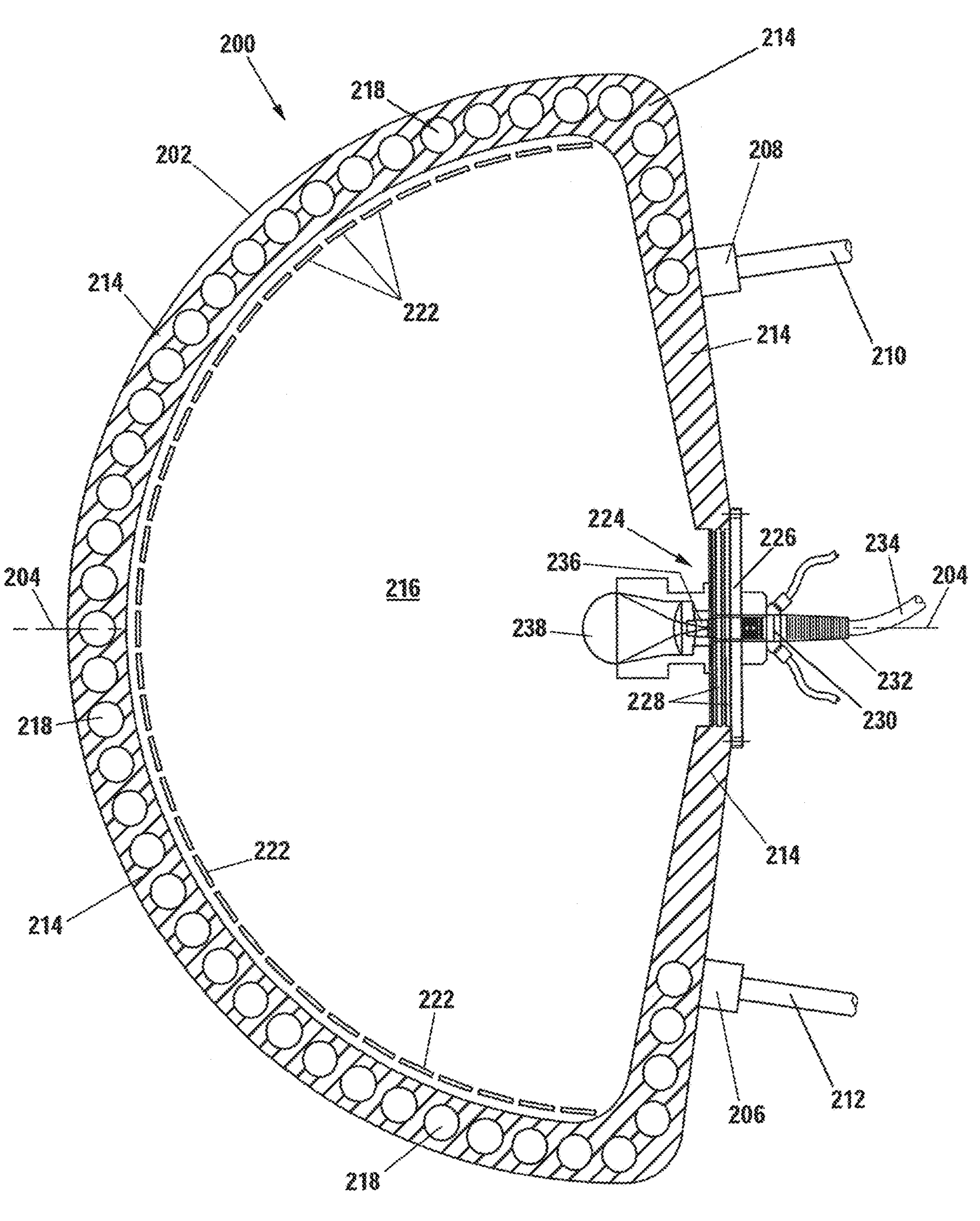
FIG. 10 is a partial section view of another alternative embodiment of the invention.

FIG. 10 shows yet another embodiment 200 that comprises a generally hemispherical housing 202 symmetrical about an axis 204. The housing includes an inlet port 206 and an outlet port 208 connected to first and second pipe segments 210, 212, respectively. The housing 202 is formed around a beryllium oxide or similarly effective heat sink 214, which defines a hemispherical cavity 216. Heat sink 214 advantageously has material properties that would allow the structure defined by 200 to resist failure under any external hydrostatic pressure in a realistic working environment (e.g., full ocean depth on Earth). Fluid channels 218 run through the heat sink 214 and form a fluid communication path between the inlet and outlet ports 206, 208. A generally-hemispherical array of photovoltaic chips 222 is mounted proximal to the boundary of the cavity 216 and the heat sink 214.

The housing 202 forms an opening 224 that is closed with an end plate 226 and seals 228. A high power connector 230 extends through the end plate 226 and is connected at one end 232 to a fiber-optic cable 234. A second end 236 of the connector 230 is oriented to direct optical energy into the cavity 216 and toward beam forming optics 238 mounted to the end plate 226. The beam forming optics 238 are configured to disburse received optical energy in a hemispherical emission pattern of uniform flux toward the photovoltaic chips 222.

Operation of this embodiment 200 is substantially similar to operation of the previously-described embodiments. Optical power is received from the fiber optic line 234 and emitted from the connector 230 toward beam forming optics 238. In this embodiment, however, there is a single hemispherical array, with each PV chip 222 spaced equidistantly from the beam forming optics 238. Thus, each PV chip 222 of the array receives the same amount of optical energy from the beam forming optics 238.

Figure 11:
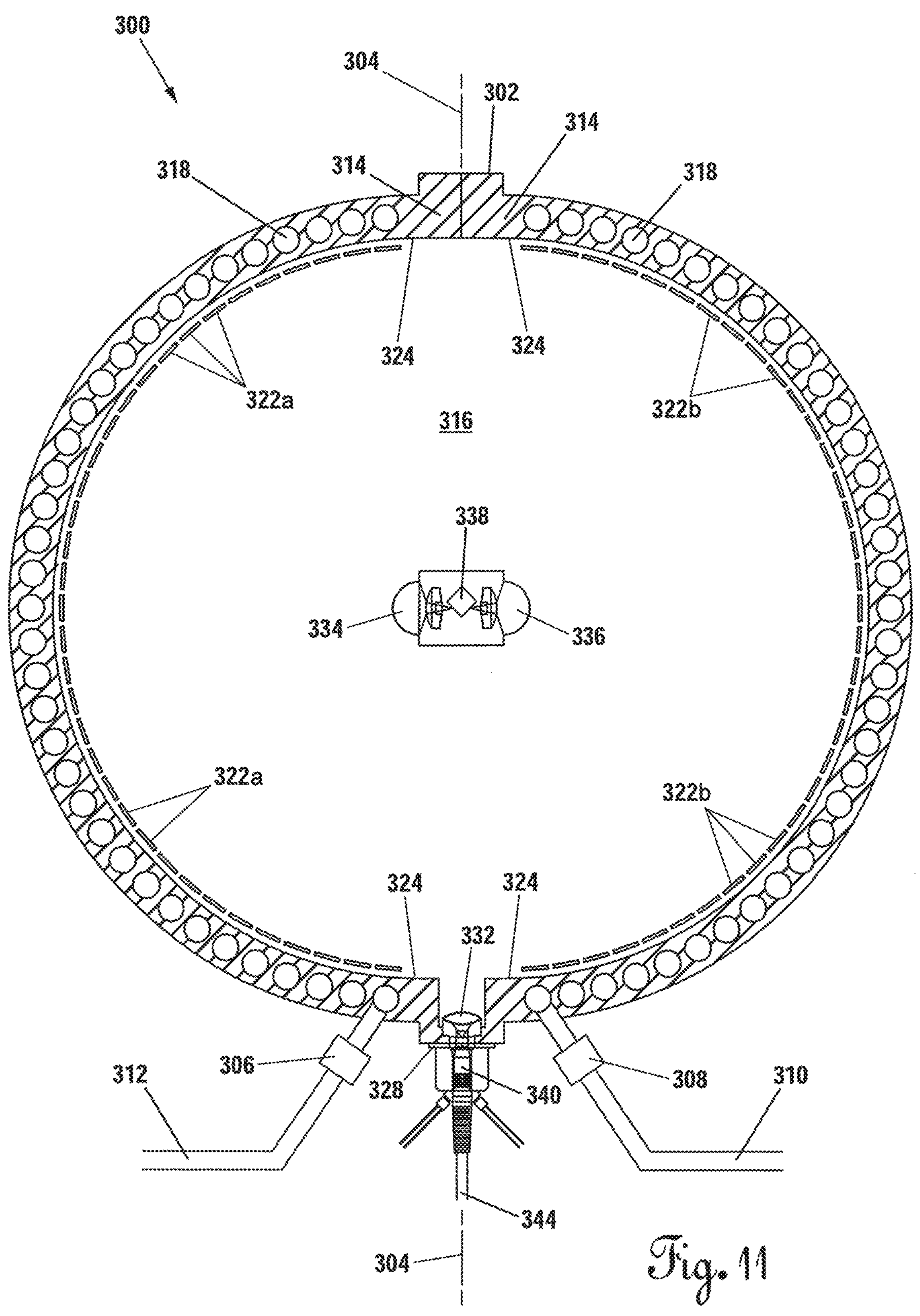
FIG. 11 is a partial section view of still another alternative embodiment of the invention.

FIG. 11 shows yet another embodiment 300 that comprises a generally-spherical housing 302 symmetrical about an axis 304. The housing includes an inlet port 306 and an outlet port 308 connected to first and second pipe segments 310, 312, respectively. The housing 302 is formed around a beryllium oxide or similarly heat conducting yet structurally viable material heat sink 314, which defines a spherical cavity 316. Fluid channels 318 run through the heat sink 314 and form a fluid communication path between the inlet and outlet ports 306, 308.

A high power connector 340 extends through the end plate 328 and is connected at one end to a fiber optic cable 344. The opposing end of the connector 340 is configured to direct optical energy toward the first beam forming optics 332.

A generally-spherical array of photovoltaic chips 322 is mounted to the inner surface 324 of the housing proximal to the heat sink 314. The array comprises first and second hemispherical arrays of chips 322*a*, 332*b* symmetrically aligned on either side of the axis 304.

The housing 302 forms an opening 326 that is closed with an end plate 328 and seals. First beam forming optics 332 are positioned in the cavity 316 and mounted to the end plate 328. Second and third beam forming optics 334, 336 are positioned in the cavity 316 proximal to its center. An optical splitter 338 is positioned between the second and third beam forming optics 334, 336. The first beam forming optics 332 are configured to direct received optical energy toward the optical splitter 338, which is configured to split and direct the received optical energy to the second and third beam forming optics 334, 336. The second beam forming optics 334 are configured to direct received optical energy to the first hemispherical array 322*a*. The third beam forming optics 336 are configured to direct received optical energy to the second hemispherical energy 322*b*.

Operation of this embodiment 300 is substantially similar to operation of the previously-described embodiments. Optical power is received from the fiber optic cable 344 and emitted from the high power connector 340 toward first beam forming optics 332. The first beam forming optics 332 direct the received optical energy toward the splitter 338, which divides the received energy and directs it towards the second and third beam-forming optics 334, 336. Second and third beam forming optics 334, 336 direct the energy to the first and second hemispherical arrays 322*a-b*, respectively.

As optical energy impinges on the arrays 332*a-b*, the received energy is converted to heat and transfers to the heat sink 314. A work fluid moving through the fluid channels 318 is heated and transfers the energy to the outlet port 308 for later use by a fluidly-connected apparatus (e.g., a Stirling engine).

Figure 12:
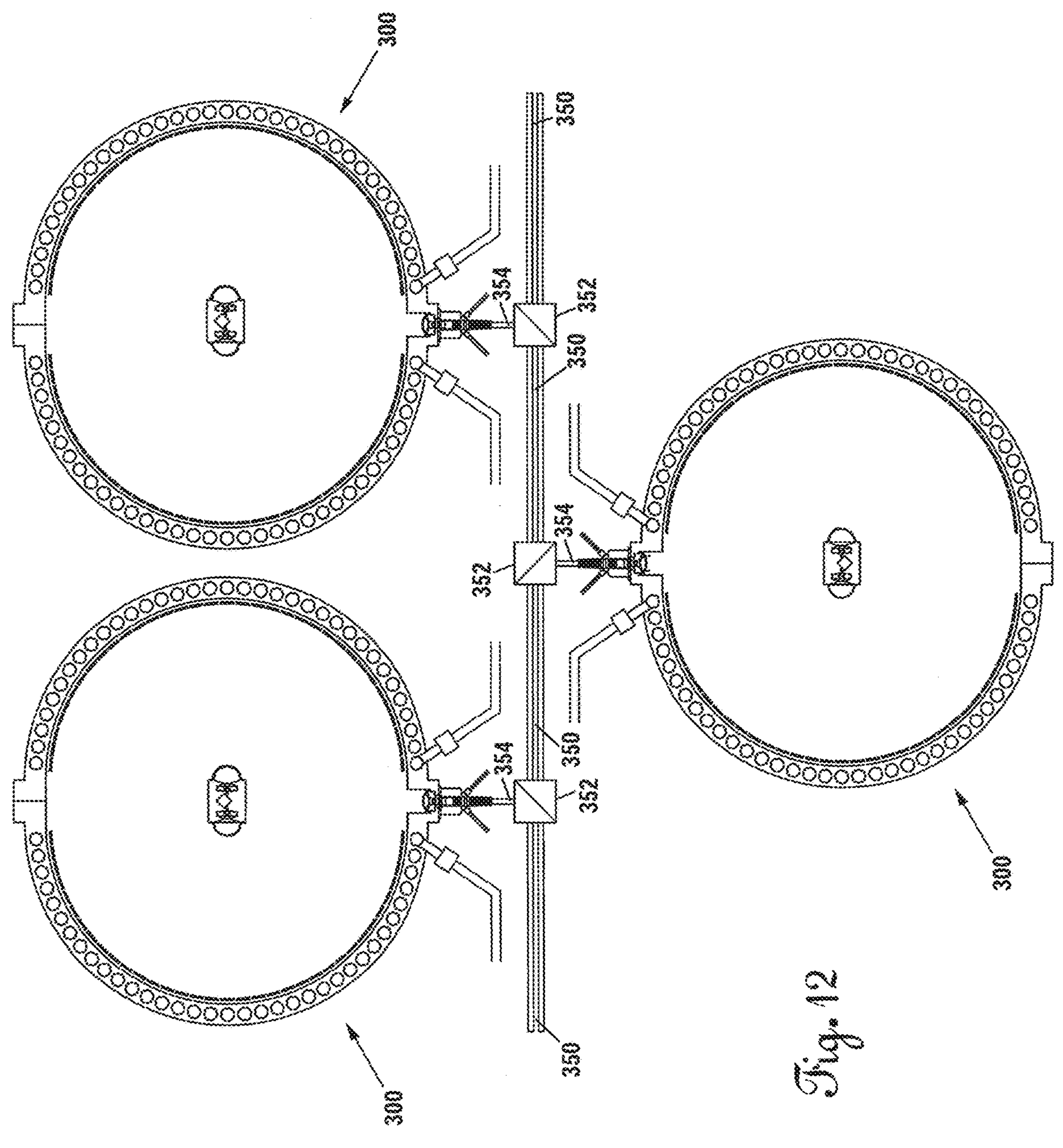
FIG. 12 is a system view of multiple spherical arrays optically connected to the same fiber optic line.

The various embodiments described herein may be used singularly or in conjunction with other similar devices. Due to limits to size of power generation chambers (controlled by structural design and hydrostatic force build up at great depth underwater), generating more power means modular power generation systems. For example, FIG. 12 shows a configuration that incorporates multiple instances of the embodiment 300 described with reference to FIG. 11. Optical power traverses a photonic power train 350 and is divided by a series of optical non-linear beam splitters 352 to branch fiber lines 354 that are in optical communication with the embodiments 300. The design of beam splitters 352 is advantageously directed to transferring equal amounts of power to all power generation elements 300 and also to minimizing the power lost at each beam splitter. Stated differently, a primary photonic power train or pipeline 350 with a series of optical non-linear fractional beam splitters 352 transfers a standard portion of the beam from the pipeline 350 to a power generation sphere, depicted as embodiment 300. Each primary pipeline beam splitter 352 splits off exactly the standard flux needed to operate an embodiment 300, e.g., a power sphere (or power cylinder), and send the rest on to the next primary pipeline beam splitter 352. Each of these successive beam splitters 352 would be sending a greater percentage of the remaining pipeline flux to subsequent power spheres (or cylinders). In the embodiment shown in FIG. 12, if only three embodiments 300 were being used, the first beam splitter 352 would divert 33⅓% of the total power to the first embodiment 300. The second beam splitter 352 would divert 50% of the remaining power to the second embodiment 300. The third beam splitter 352 would not be needed as the pipeline 350 would end in the third embodiment 300.

The present disclosure includes preferred or illustrative embodiments in which specific power conversion modules are described. Alternative embodiments of such devices can be used in carrying out the invention as claimed and such alternative embodiments are limited only by the claims themselves. Other aspects and advantages of the present invention may be obtained from a study of this disclosure and the drawings, along with the appended claims.

We claim:

1. A power conversion module for use with optical energy transfer and conversion system, said module comprising:

a housing having a spherical configuration;

an end plate connected to said housing, said end plate and housing defining a cavity;

an inlet and outlet port connected to said housing;

an actively cooled high power connector having one end connected to a fiber optic cable and an opposite end traversing said end plate and extending within said cavity;

a first beam forming optics within said cavity, said first beam forming optics in optical communication with said actively cooled high power connector;

a second beam forming optics within said cavity, said second beam forming optics in optical communication with said first beaming forming optics and configured to disburse received optical energy in a hemispherical emission pattern of uniform flux toward a first hemispherical array of photovoltaic chips;

a third beam forming optics within said cavity, said third beam forming optics in optical communication with said first beam forming optics and configured to disburse received optical energy in a hemispherical emission pattern of uniform flux toward a second hemispherical array of photovoltaic chips;

an optical splitter within a center of said housing, said optical splitter between second and third beam forming optics and in optical communication with said first, second and third beam forming optics, said optical splitter configured to split and direct the received optical energy to said second and third beam forming optics;

a heat sink within said housing and having a plurality of fluid channels therethrough, said plurality of fluid channels forming a fluid circulation path between said inlet and outlet ports;

a work fluid in fluid communication with said heat sink, said work fluid for transferring heat via said outlet port; and the first and second hemispherical arrays of photovoltaic chips mounted in complementary configuration to said hosing within said cavity, each photovoltaic chip of said first hemispherical array of photovoltaic chips spaced equidistantly from said second beam forming optics, and each photovoltaic chip of said second hemispherical array of photovoltaic chips spaced equidistantly from said third beam forming optics.

2. A multiple power conversion system comprising:

a plurality of power conversion modules, each of said plurality of power conversion modules comprising;

a housing having a spherical configuration and a plurality of channels therethrough;

an end plate connected to said housing, said end plate and housing defining a cavity;

an inlet and outlet port connected to said housing;

an actively cooled high power connector having one end connected to a fiber optic cable and an opposite end traversing said end plate and extending within said cavity;

a first beam forming optics within said cavity, said first beam forming optics in optical communication with said actively cooled high power connector;

a second beam forming optics within said cavity, said second beam forming optics in optical communication with said first beaming forming optics and configured to disburse received optical energy in a hemispherical emission pattern of uniform flux toward a first hemispherical array of photovoltaic chips;

a third beam forming optics within said cavity, said third beam forming optics in optical communication with said first beam forming optics and configured to disburse received optical energy in a hemispherical emission pattern of uniform flux toward a second hemispherical array of photovoltaic chips;

an optical splitter within a center of said housing, said optical splitter between second and third beam forming optics and in optical communication with said first, second and third beam forming optics, said optical splitter configured to split and direct the received optical energy to said second and third beam forming optics;

a heat sink within said housing and having a plurality of fluid channels therethrough, said plurality of fluid channels forming a fluid circulation path between said inlet and outlet ports;

a work fluid in fluid communication with said heat sink, said work fluid for transferring heat via said outlet port; and the first and second hemispherical arrays of photovoltaic chips mounted in complementary configuration to said hosing within said cavity, each photovoltaic chip of said first hemispherical array of photovoltaic chips spaced equidistantly from said second beam forming optics, and each photovoltaic chip of said second hemispherical array of photovoltaic chips spaced equidistantly from said third beam forming optics;

a photonic power train in optical communication with said plurality of power conversion systems; and a plurality of beam splitters in optical communication with said plurality of power conversion systems, said plurality of beam splitters configured to transfer a portion of the optical energy from said photonic power train to each of said plurality of power conversion systems.

* * * * *